United States Patent
Li

(10) Patent No.: US 10,667,352 B2
(45) Date of Patent: May 26, 2020

(54) PWM SIGNAL GENERATING SYSTEM AND LIGHT DEVICE DRIVING SYSTEM

(71) Applicant: LEEDARSON AMERICA INC., Smyrna, GA (US)

(72) Inventor: Yongchuan Li, Smyrna, GA (US)

(73) Assignee: LEEDARSON AMERICA INC., Smyrna, GA (US)

(*) Notice: Subject to any disclaimer, the term of this patent is extended or adjusted under 35 U.S.C. 154(b) by 0 days.

(21) Appl. No.: 16/234,640

(22) Filed: Dec. 28, 2018

(65) Prior Publication Data
US 2019/0239304 A1    Aug. 1, 2019

Related U.S. Application Data

(60) Provisional application No. 62/622,949, filed on Jan. 28, 2018.

(51) Int. Cl.
| | |
|---|---|
| H05B 45/10 | (2020.01) |
| H02M 7/06 | (2006.01) |
| H03K 3/017 | (2006.01) |
| H02M 1/44 | (2007.01) |
| H05B 45/37 | (2020.01) |
| H02M 1/00 | (2006.01) |
| H03K 7/08 | (2006.01) |

(52) U.S. Cl.
CPC ............. *H05B 45/10* (2020.01); *H02M 1/44* (2013.01); *H02M 7/06* (2013.01); *H03K 3/017* (2013.01); *H05B 45/37* (2020.01); *H02M 2001/0009* (2013.01); *H03K 7/08* (2013.01)

(58) Field of Classification Search
CPC . H05B 33/0845; H05B 33/0815; H02M 1/44; H02M 7/06; H02M 2001/0009; H03K 3/017
See application file for complete search history.

(56) References Cited

U.S. PATENT DOCUMENTS

| | | | | |
|---|---|---|---|---|
| 2012/0287093 | A1* | 11/2012 | Gotoh | G06F 3/0412 345/204 |
| 2016/0233671 | A1* | 8/2016 | Chuang | H02J 1/00 |
| 2016/0330808 | A1* | 11/2016 | Brandt | H05B 33/0845 |

* cited by examiner

*Primary Examiner* — Raymond R Chai
(74) *Attorney, Agent, or Firm* — Chun-Ming Shih; LanWay IPR Services

(57) ABSTRACT

A PWM signal generating system comprising: a PWM signal generating circuit, configured to generate a PWM signal; a control IC, configured to control a PWM ratio of the PWM signal via controlling the PWM signal generating circuit; a phase cutting dimmer, configured to output a phase cutting signal to the control IC according to a phase of an input signal; a current detecting circuit, configured to provide a detect current corresponding to the PWM ratio; and a voltage level dimmer, configured to generate a preliminary PWM ratio control signal corresponding to an input voltage level. The control IC controls the PWM ratio to correspond to the phase of the input signal, according to the detect current in a first mode. The control IC controls the PWM ratio according to the preliminary PWM ratio control signal in a second mode.

10 Claims, 7 Drawing Sheets

US 10,667,352 B2

PWM SIGNAL GENERATING SYSTEM AND LIGHT DEVICE DRIVING SYSTEM

CROSS REFERENCE TO RELATED APPLICATION

The present application claims priority of U.S. Patent Provisional Application No. 62/622,949 filed on Jan. 28, 2018.

FIELD

The present invention relates to a PWM signal generating system and a light device driving system, and particularly relates to a PWM signal generating system and a light device driving system having different kinds of dimmers.

BACKGROUND

Conventionally, the luminance level for light devices can be controlled by dimmers. Corresponding to different requirements, different kinds of dimmers can be applied. The dimmers can be, for example, Triac, voltage level control, wireless, PWM control.

However, in order to meet requirements for different clients, the manufacturers need to respectively prepare a large number of lighting devices with different kinds of dimmers. Therefore, the storage cost and manufacturing cost are greatly increased.

SUMMARY OF INVENTION

Therefore, one objective of the present invention is to provide a PWM signal generating system having different kinds of dimmers.

Another objective of the present invention is to provide a light device driving system having different kinds of dimmers.

One embodiment of the present invention discloses a PWM signal generating system comprising a PWM signal generating circuit, a control IC, a phase cutting dimmer, a current detecting circuit, and a voltage level dimmer. The PWM signal generating circuit is configured to generate a PWM signal. The control IC is coupled to the PWM signal generating circuit, and is configured to control a PWM ratio of the PWM signal via controlling the PWM signal generating circuit. The phase cutting dimmer is coupled to the control IC, and is configured to output a phase cutting signal to the control IC according to a phase of an input signal. The current detecting circuit is coupled to the PWM signal generating circuit and the control IC, and is configured to provide a detect current corresponding to the PWM ratio. The voltage level dimmer is coupled to the control IC, and is configured to generate a preliminary PWM ratio control signal corresponding to an input voltage level. The control IC controls the PWM ratio to correspond to the phase of the input signal, according to the detect current in a first mode. The control IC controls the PWM ratio according to the preliminary PWM ratio control signal in a second mode.

In one embodiment, the PWM signal generating system further comprises an auxiliary activate circuit. The auxiliary activate circuit is coupled to the phase cutting dimmer, and is configured to increase an activate speed of the phase cutting dimmer according to the input signal.

In one embodiment, the auxiliary activate circuit comprises a first resistor, a first diode, an NMOS, a second diode, a first Zener diode, a third diode, at least one second resistor, a BJT, a third resistor, a second Zener diode, at least one fourth resistor, a fifth resistor and a capacitor. The first resistor comprises a first terminal coupled to a first predetermined voltage source, and comprises a second terminal. The first diode comprises a first terminal coupled to the second terminal of the first resistor, and comprises a second terminal. The NMOS comprises a drain terminal coupled to the second terminal of the first diode. The second diode comprises a first terminal coupled to a source terminal of the NMOS, and comprises a second terminal coupled to the phase cutting dimmer. The first Zener diode comprises a first terminal coupled to a gate terminal of the NMOS, and comprises a second terminal coupled to a ground voltage source. The third diode comprises a first terminal coupled to the second terminal of the first Zener diode, and comprises a second terminal coupled to a source terminal of the NMOS. The at least one second resistor is coupled in series and coupled between the first predetermined voltage source and the gate terminal of the NMOS. The BJT comprises a collector coupled to the gate terminal of the NMOS, and comprises an emitter coupled to the ground voltage source. The third resistor comprises a first terminal coupled to a base of the BJT and comprising a second terminal. The second Zener diode comprises a first terminal coupled to the second terminal of the third resistor, and comprises a second terminal. The at least one fourth resistor is coupled in series and is coupled between the first predetermined voltage source and the second terminal of the second Zener diode. The fifth resistor is coupled between the second terminal of the second Zener diode and the ground voltage source. The capacitor is coupled between the second terminal of the second Zener diode and the ground voltage source.

In one embodiment, the PWM signal generating system further comprises an RC filter. The RC filter is coupled to the auxiliary activate circuit, and is configured to filter the input signal.

In one embodiment, the RC filter comprises a first resistor, a first capacitor, an NMOS, a second resistor, a BJT, a third resistor, a first diode, at least one fourth resistor, a fifth resistor, a second capacitor, a second diode, a third capacitor, and at least one sixth resistor. The first resistor comprises a first terminal coupled to a first predetermined voltage source, and comprising a second terminal. The first capacitor comprises a first terminal coupled to the second terminal of the first resistor, and comprises a second terminal. The NMOS comprises a drain terminal coupled to the second terminal of the first capacitor. The second resistor comprises a first terminal coupled to a gate terminal of the NMOS, and comprises a second terminal coupled to a ground voltage source. The BJT comprises a collector coupled to the gate terminal of the NMOS. The third resistor comprises a first terminal coupled to a second predetermine voltage source, and comprises a second terminal coupled to an emitter of the BJT. The first diode comprises a first terminal coupled to a base of the BJT, and comprises a second terminal. The at least one fourth resistor is coupled in series and coupled between the first predetermined voltage source and the second terminal of the first diode. The fifth resistor is coupled between the second terminal of the first diode and the ground voltage source. The second capacitor is coupled between the second terminal of the first diode and the ground voltage source. The second diode comprises a first terminal coupled to the first predetermined voltage source, and comprises a second terminal. The third capacitor is coupled between the second terminal of the second diode and the ground voltage source. The at least one sixth resistor is coupled in series and coupled between the first predetermined voltage level and the ground voltage source.

In one embodiment, the PWM signal generating circuit comprises an NMOS, a first resistor, a second resistor, a third resistor and a diode. The first resistor comprises a first terminal coupled to a source terminal of the NMOS, and comprises a second terminal coupled to the control IC. The second resistor comprises a first terminal coupled to a source terminal of the NMOS, and comprises a second terminal. The third resistor comprises a first terminal coupled to a source terminal of the NMOS, and comprises a second terminal coupled to the current detecting circuit. The diode comprises a first terminal coupled to the second terminal of the second resistor, and comprises a second terminal coupled to the control IC. The current detecting circuit is coupled to the source terminal of the NMOS.

In one embodiment, the current detecting circuit comprises a plurality of resistors coupled in parallel and between the source terminal of the NMOS and a ground voltage source.

In another embodiment, a light device driving system is disclosed. The light device driving system comprises a main power receiving circuit, an EMI filter, a bridge rectifier, a transformer, a PWM signal generating circuit, a control IC, a phase cutting dimmer, a current detecting circuit, and a voltage level dimmer. The main power receiving circuit is configured to receive a main power. The EMI filter is coupled to the main power receiving circuit. The bridge rectifier is coupled to the EMI filter. The EMI filter and the bridge rectifier process the main power, thereby the bridge rectifier outputs an input signal. The transformer is configured to receive the input signal and a PWM signal for generating an output current OC to drive a light device. The PWM signal generating circuit is configured to generate the PWM signal. The control IC is coupled to the PWM signal generating circuit, and is configured to control a PWM ratio of the PWM signal via controlling the PWM signal generating circuit. The phase cutting dimmer is coupled to the control IC, and is configured to output a phase cutting signal to the control IC according to a phase of the input signal. The current detecting circuit is coupled to the PWM signal generating circuit and the control IC, and is configured to provide a detect current corresponding to the PWM ratio. The voltage level dimmer is coupled to the control IC, and is configured to generate a preliminary PWM ratio control signal corresponding to an input voltage level. The control IC controls the PWM ratio to correspond to the phase of the input signal, according to the detect current in a first mode. The control IC controls the PWM ratio according to the preliminary PWM ratio control signal in a second mode.

In one embodiment, the light device driving system further comprises: an auxiliary activate circuit. The auxiliary activate circuit is coupled to the phase cutting dimmer, and is configured to increase an activate speed of the phase cutting dimmer according to the input signal.

In one embodiment, the auxiliary activate circuit comprises a first resistor, a first diode, an NMOS, a second diode, a first Zener diode, a third diode, at least one second resistor, a BJT, a third resistor, a second Zener diode, at least one fourth resistor, a fifth resistor and a capacitor. The first resistor comprises a first terminal coupled to a first predetermined voltage level, and comprises a second terminal. The first diode comprises a first terminal coupled to the second terminal of the first resistor, and comprises a second terminal. The NMOS comprises a drain terminal coupled to the second terminal of the first diode. The second diode comprises a first terminal coupled to a source terminal of the NMOS, and comprises a second terminal coupled to the phase cutting dimmer. The first Zener diode comprises a first terminal coupled to a gate terminal of the NMOS, and comprises a second terminal coupled to a ground voltage source. The third diode comprises a first terminal coupled to the second terminal of the first Zener diode, and comprises a second terminal coupled to a source terminal of the NMOS. The at least one second resistor is coupled in series and coupled between the first predetermined voltage source and the gate terminal of the NMOS. The BJT comprises a collector coupled to the gate terminal of the NMOS, and comprises an emitter coupled to the ground voltage source. The third resistor comprises a first terminal coupled to a base of the BJT and comprises a second terminal. The second Zener diode comprises a first terminal coupled to the second terminal of the third resistor, and comprises a second terminal. The at least one fourth resistor is coupled in series and coupled between the first predetermined voltage source and the second terminal of the second Zener diode. The fifth resistor is coupled between the second terminal of the second Zener diode and the ground voltage source. The capacitor is coupled between the second terminal of the second Zener diode and the ground voltage source.

In one embodiment, the light device driving system further comprises an RC filter. The RC filter is coupled to the auxiliary activate circuit, and is configured to filter the input signal.

In one embodiment, the RC filter comprises a first resistor, a first capacitor, an NMOS, a second resistor, a BJT, a third resistor, a first diode, at least one fourth resistor, a fifth resistor, a second capacitor, a second diode, a third capacitor, and at least one sixth resistor. The first resistor comprises a first terminal coupled to a first predetermined voltage source, and comprising a second terminal. The first capacitor comprises a first terminal coupled to the second terminal of the first resistor, and comprises a second terminal. The NMOS comprises a drain terminal coupled to the second terminal of the first capacitor. The second resistor comprises a first terminal coupled to a gate terminal of the NMOS, and comprises a second terminal coupled to a ground voltage source. The BJT comprises a collector coupled to the gate terminal of the NMOS. The third resistor comprises a first terminal coupled to a second predetermine voltage source, and comprises a second terminal coupled to an emitter of the BJT. The first diode comprises a first terminal coupled to a base of the BJT, and comprises a second terminal. The at least one fourth resistor is coupled in series and coupled between the first predetermined voltage source and the second terminal of the first diode. The fifth resistor is coupled between the second terminal of the first diode and the ground voltage source. The second capacitor is coupled between the second terminal of the first diode and the ground voltage source. The second diode comprises a first terminal coupled to the first predetermined voltage source, and comprises a second terminal. The third capacitor is coupled between the second terminal of the second diode and the ground voltage source. The at least one sixth resistor is coupled in series and coupled between the first predetermined voltage source and the ground voltage source.

In one embodiment, the PWM signal generating circuit comprises an NMOS, a first resistor, a second resistor, a third resistor and a diode. The first resistor comprises a first terminal coupled to a source terminal of the NMOS, and comprises a second terminal coupled to the control IC. The second resistor comprises a first terminal coupled to a source terminal of the NMOS, and comprises a second terminal. The third resistor comprises a first terminal coupled to a source terminal of the NMOS, and comprises a second terminal coupled to the current detecting circuit. The diode comprises a first terminal coupled to the second terminal of the second resistor, and comprises a second terminal coupled to the control IC. The current detecting circuit is coupled to the source terminal of the NMOS.

In one embodiment, the current detecting circuit comprises a plurality of resistors coupled in parallel and between the source terminal and a ground voltage source.

In view of above-mentioned embodiments, the present invention can provide a light device driving system having more than one kinds of the dimmers. Thus, the manufactures do not need to respectively prepare a large number of lighting devices with different kinds of dimmers for different clients. Therefore, the storage cost and manufacturing cost can be reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
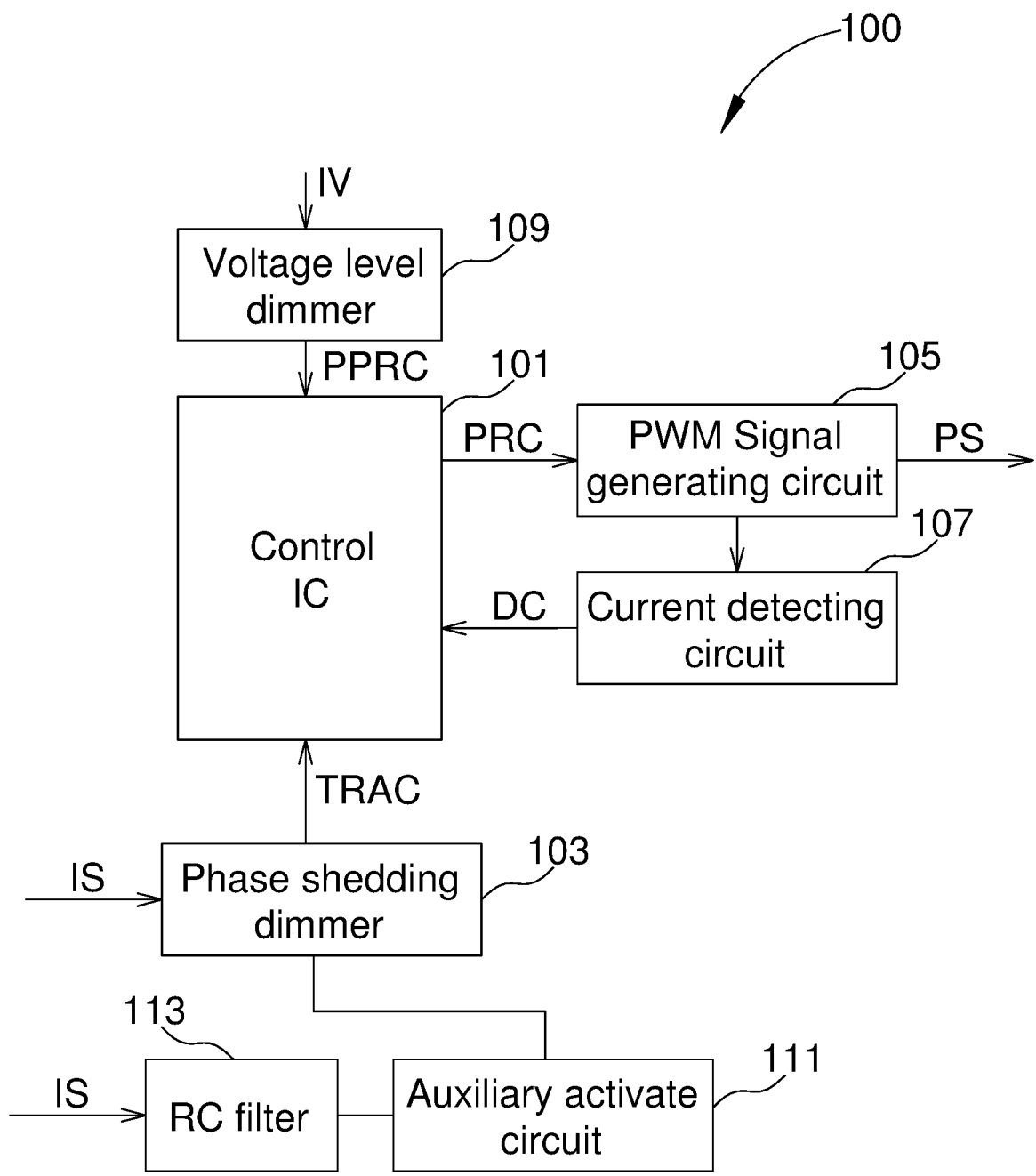
FIG. 1 is a block diagram illustrating a PWM signal generating system according to one embodiment of the present invention.

FIG. 1 is a block diagram illustrating a PWM signal generating system according to one embodiment of the present invention. As illustrated in FIG. 1, the PWM signal generating system 100 comprises a control IC (integrated circuit) 101, a phase cutting dimmer 103, a PWN signal generating circuit 105, a current detecting circuit 107, and a voltage level dimmer 109. The PWM signal generating circuit 105 is configured to generate a PWM signal PS. The control IC 101 is coupled to the PWM signal generating circuit 105, and is configured to control a PWM ratio of the PWM signal PS via controlling the PWM signal generating circuit 105. The phase cutting dimmer 103 is coupled to the control IC 101, and is configured to output a phase cutting signal TRIAC to the control IC 101 according to a phase of an input signal IS. The current detecting circuit 107 is coupled to the PWM signal generating circuit 105 and the control IC 101, and is configured to provide a detect current DC corresponding to the PWM ratio of the PWM signal PS. The voltage level dimmer 109 is coupled to the control IC 101, and is configured to generate a preliminary PWM ratio control signal PPRC corresponding to an input voltage level IV. In one embodiment, the voltage level dimmer 109 is a dimmer ranging from 0 volt to 10 volts, but is not limited to such range in other embodiments.

The PWM signal generating system 100 can operate in different modes. In an exemplary first mode, the control IC 101 controls the PWM ratio of the PWM signal PS to correspond to the phase of the input signal IS, according to the detect current DC. In an exemplary second mode, the control IC 101 controls the PWM ratio of the PWM signal PS according to the preliminary PWM ratio control signal PPRC. Via applying the phase cutting dimmer 103 and the voltage level dimmer 109, a user of the PWM signal generating system 100 can select a most proper dimmer for different conditions.

In one embodiment, the PWM signal generating system further comprises an auxiliary activate circuit 111 and a RC filter 113. The auxiliary activate circuit 111 is coupled to the phase cutting dimmer 103 and is configured to increase an activate speed of the phase cutting dimmer 103 according to the input signal IS. Further, the RC filter 113 is coupled to the auxiliary activate circuit 111, and is configured to filter the input signal IS for the phase cutting dimmer 103.

Figure 2:
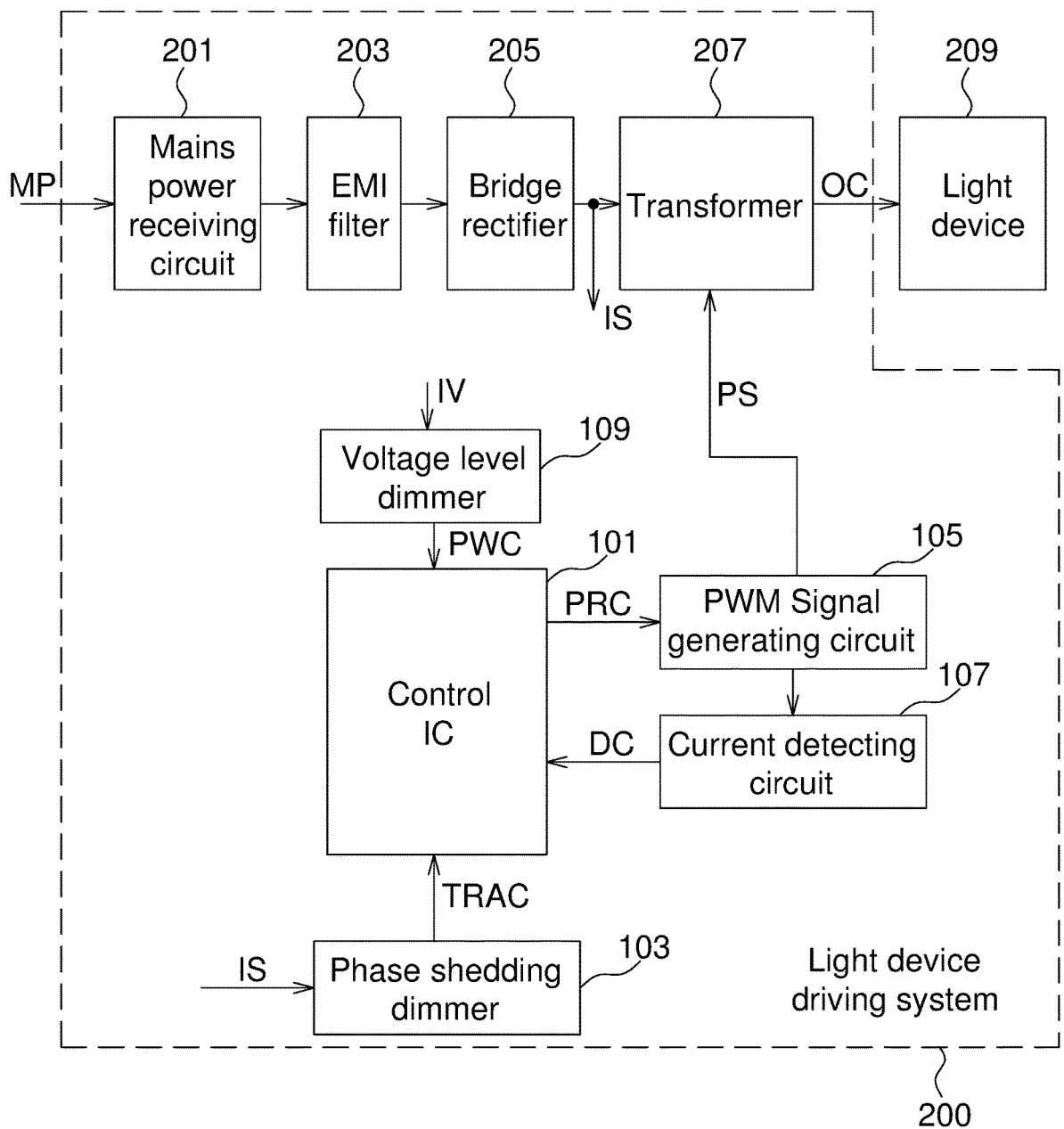
FIG. 2 is a block diagram illustrating a light device driving system according to one embodiment of the present invention.

The PWM signal generating system 100 illustrated in FIG. 1 can be applied to a light device driving system. FIG. 2 is a block diagram illustrating a light device driving system 200 according to one embodiment of the present invention. As illustrated in FIG. 2, the light device system 200 comprises the control IC 101, the phase cutting dimmer 103, the PWN signal generating circuit 105, the current detecting circuit 107, and the voltage level dimmer 109 illustrated in FIG. 1. Besides, the light device system 200 further comprises a main power receiving circuit 201, an EMI filter 203, a bridge rectifier 205, and a transformer 207. The main power receiving circuit 201 receives a main power MP (e.g. 110v AC or 220v AC). The EMI filter 203 and the bridge rectifier 205 process the main power MP, thereby the bridge rectifier 205 outputs the input signal IS to the phase cutting dimmer 103. The transformer 207 receives the PWM signal PS for generating an output current OC to the light device 209. In one embodiment, the light device 209 is a light emitting diode (LED), but is not limited.

In following descriptions, examples for detail structures of partial components illustrated in FIG. 1 and FIG. 2 are provided. Please note, for better understanding, detailed structures for components well known by persons skilled in the art are not illustrated. For example, structures for the main power receiving circuit 201, the EMI filter 203, the bridge rectifier 205, and the transformer 207 illustrated in FIG. 2 may be well known by persons skilled in the art, thus will not be illustrated for more details.

Further, the phase cutting dimmer 103 and the voltage level dimmer 109 may have different structures and are well known by persons skilled in the art, thus will not be illustrated for more details.

Figure 3:
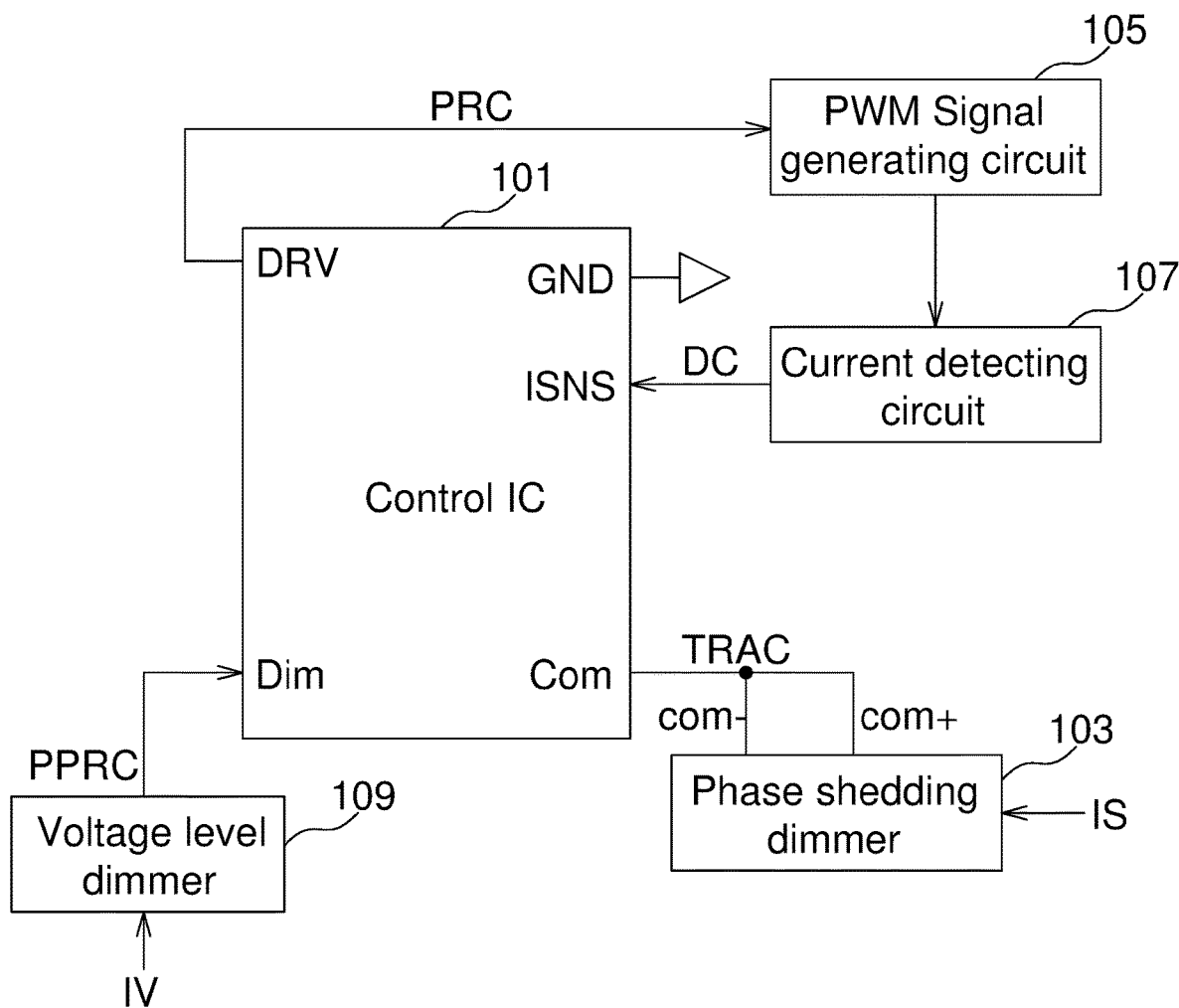
FIG. 3 is a block diagram illustrating an example for detail structures of the control IC illustrated in FIG. 2.

FIG. 3 is a block diagram illustrating an example for detail structures of the control IC 101 illustrated in FIG. 2. As illustrated in FIG. 3, the control IC 101 comprises a driving pin DRV, a dimming pin DIM, a comparing pin com, a current detecting pin ISNS and a ground pin GND. The phase cutting circuit 103 comprises two comparing terminals com− and com+, which are coupled to the comparing pin COM. The dimming pin DIM is coupled to the voltage level dimmer 109. The current detect pin ISNS receives the detect current DC.

The ground pin GND is coupled to a ground voltage source. Also, the driving pin DRV outputs a PWM ratio control signal PRC to the PWM signal generating circuit 105, to control the above-mentioned PWM ratio.

Figure 4:
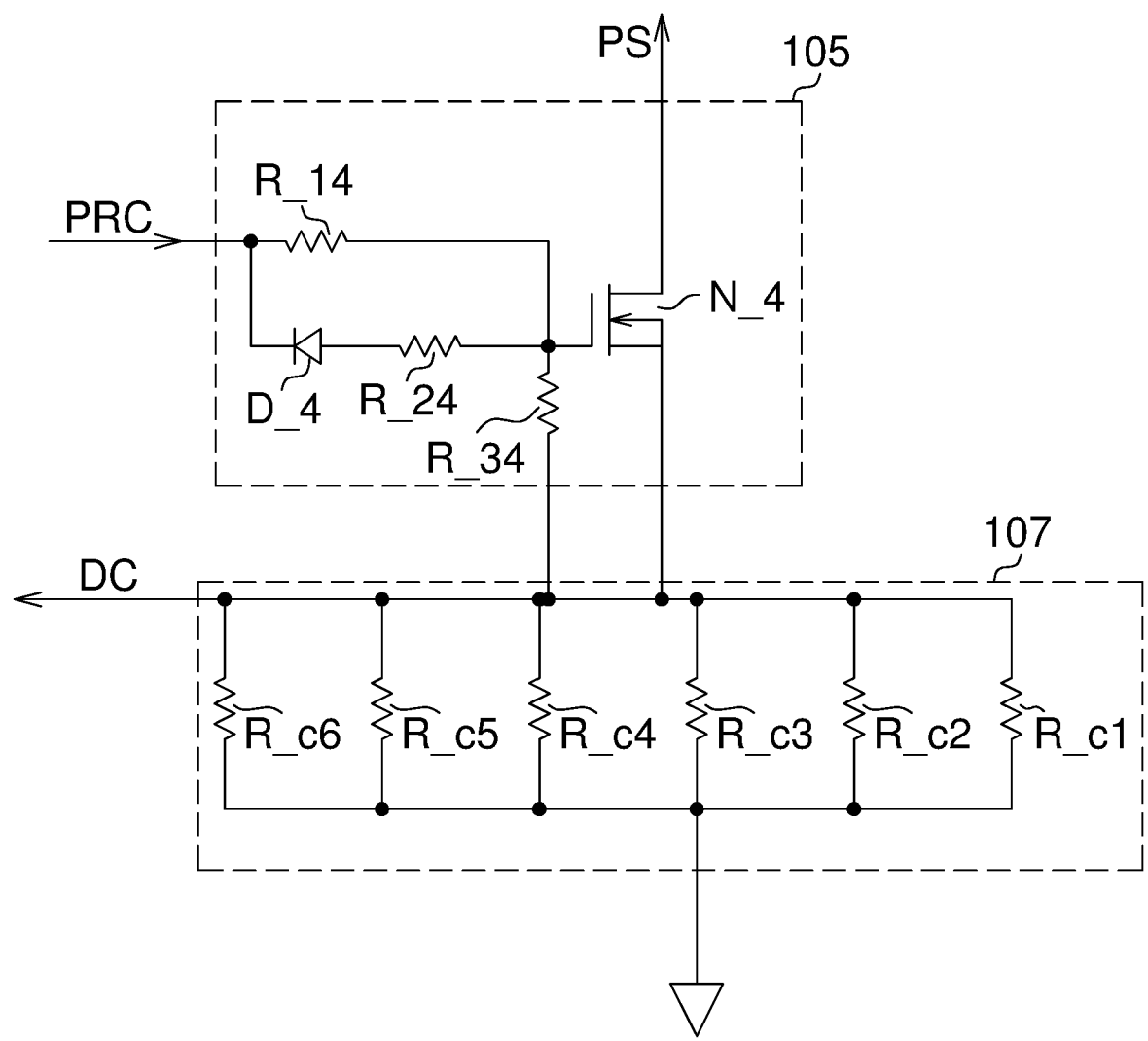
FIG. 4 is a circuit diagram illustrating an example for detail structures of the PWM signal generating circuit and the current detecting circuit illustrated in FIG. 2.

FIG. 4 is a circuit diagram illustrating an example for detailed structures of the PWM signal generating circuit 105 and the current detecting circuit 107 illustrated in FIG. 2. As illustrated in FIG. 4, the PWM signal generating circuit 105 comprises an NMOS N_4, a resistor R_14, a resistor R_24, a resistor R_34 and a diode D_4. The resistor R_14 comprises a first terminal coupled to a gate terminal of the NMOS N_4, and comprises a second terminal coupled to the control IC 101 to receive the power ratio control signal PRC. The resistor R_24 comprises a first terminal coupled to a gate terminal of the NMOS N_4, and comprises a second terminal. The resistor R_34 comprises a first terminal coupled to a gate terminal of the NMOS N_4, and comprises a second terminal coupled to the current detecting circuit 107. The diode D_4 comprises a first terminal coupled to the second terminal of the resistor R_24, and comprises a second terminal coupled to the control IC 101, to output the detect current DC. The current detecting circuit 107 is coupled to the source terminal of the NMOS N_4. Additionally, as illustrated in FIG. 4, the current detecting circuit 107 comprises a plurality of resistors, for example, R_c1, R_c2, R_c3, R_c4, R_c5, and R_c6 coupled in parallel and between the source terminal of the NMOS N_4 and a ground voltage level. In other embodiments, the number of resistors coupled in parallel in the current detecting circuit 107 may be adjusted for various requirements.

As illustrated in FIG. 4, the PWM ratio control signal PRC can be applied to the gate terminal of the NMOS N_4 for controlling the PWM ratio of the PWM signal PS. Also, the exemplary resistors R_c1, R_c2, R_c3, R_c4, R_c5, and R_c6 of the current detecting circuit 107 can drain the current generated by the NMOS N_4 to generate the detect current DC.

Figure 5:
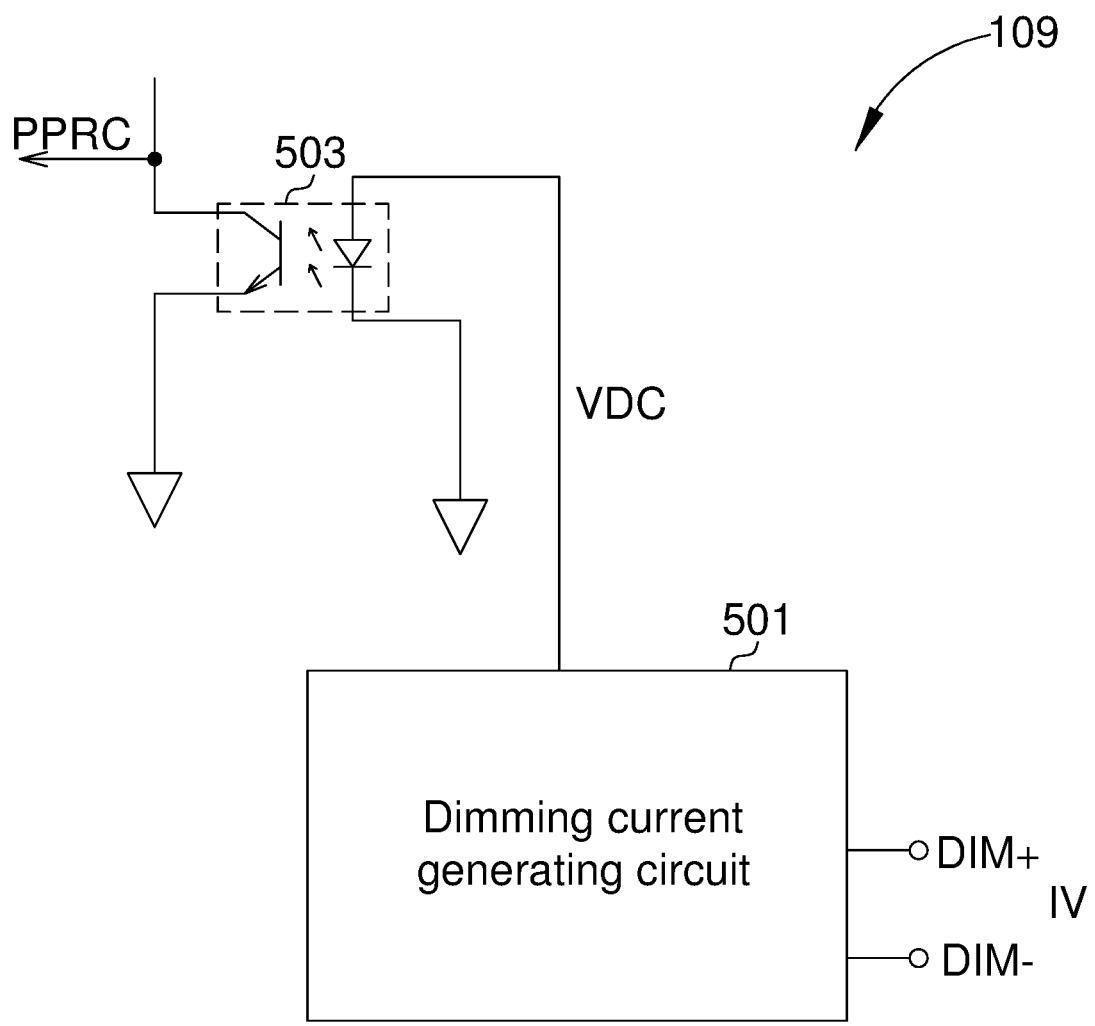
FIG. 5 is a circuit diagram illustrating an example for detail structures of the voltage level dimmer illustrated in FIG. 2.

FIG. 5 is a circuit diagram illustrating an example for detailed structures of the voltage level dimmer illustrated in FIG. 2. As illustrated in FIG. 5, the voltage level dimmer 109 comprises a dimming current generating circuit 501, which comprises a first terminal DIM+ and a second terminal DIM−. The above-mentioned input voltage level IV is the voltage difference between the first terminal DIM+ and the second terminal DIM−. The dimming current generating circuit 501 generates a dimming current VDC corresponding to the input voltage level IV, to an optical coupler 503. In turn, the optical coupler 503 receives the dimming current VDC to generate the preliminary PWM ratio control signal PPRC. In one embodiment, the preliminary PWM ratio control signal PPRC may also be a PWM signal.

Please note the preliminary PWM ratio control signal PPRC here is different from the PWM ratio control signal PRC generated by the control IC 101. The preliminary PWM ratio control signal PPRC is first transmitted to the control IC 101, and then the control IC 101 generates the PWM ratio control signal PPRC according to the preliminary PWM ratio control signal PPRC.

Figure 6:
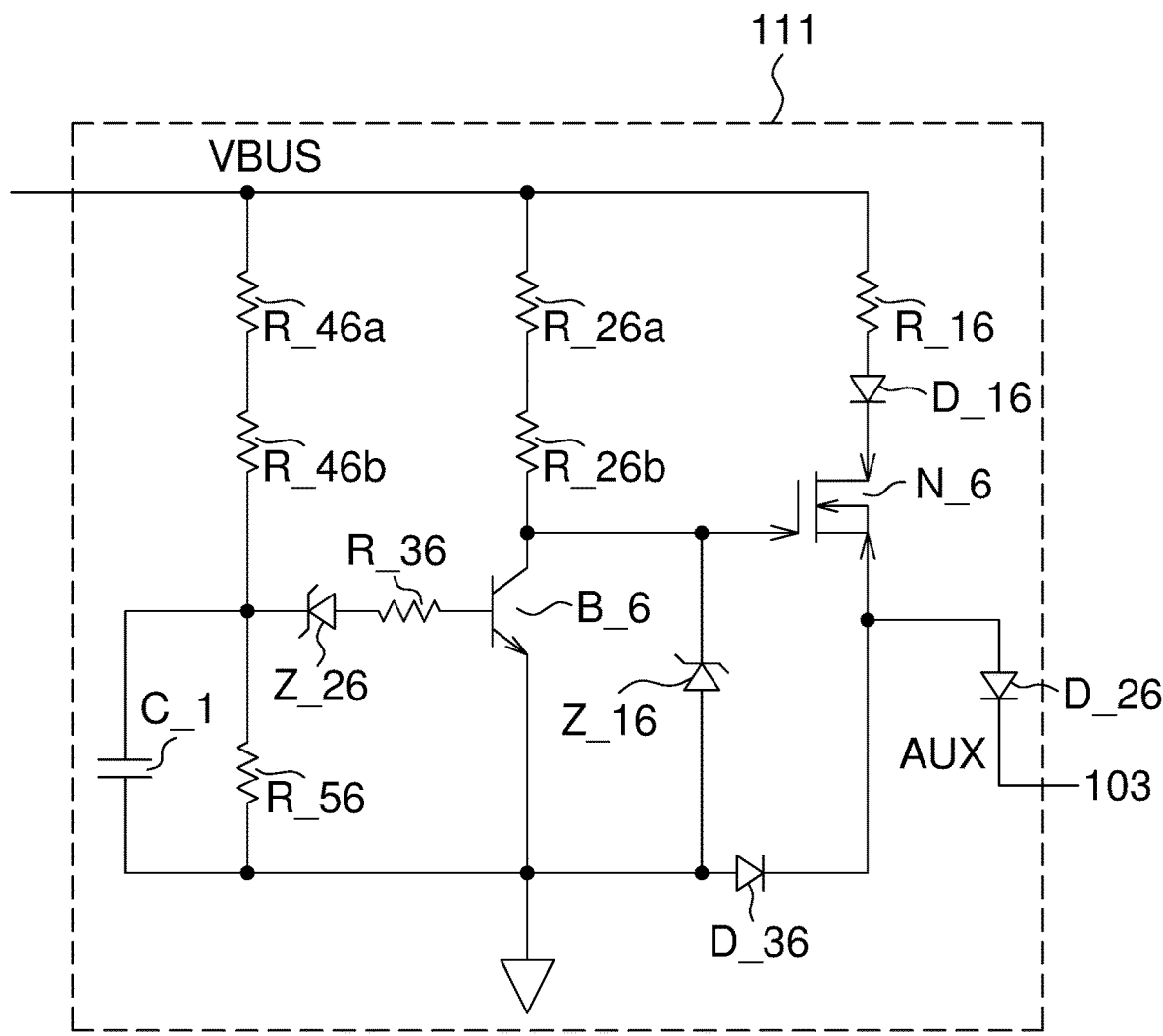
FIG. 6 is a circuit diagram illustrating an example for detail structures of the auxiliary activate circuit illustrated in FIG. 2.
Figure 7:
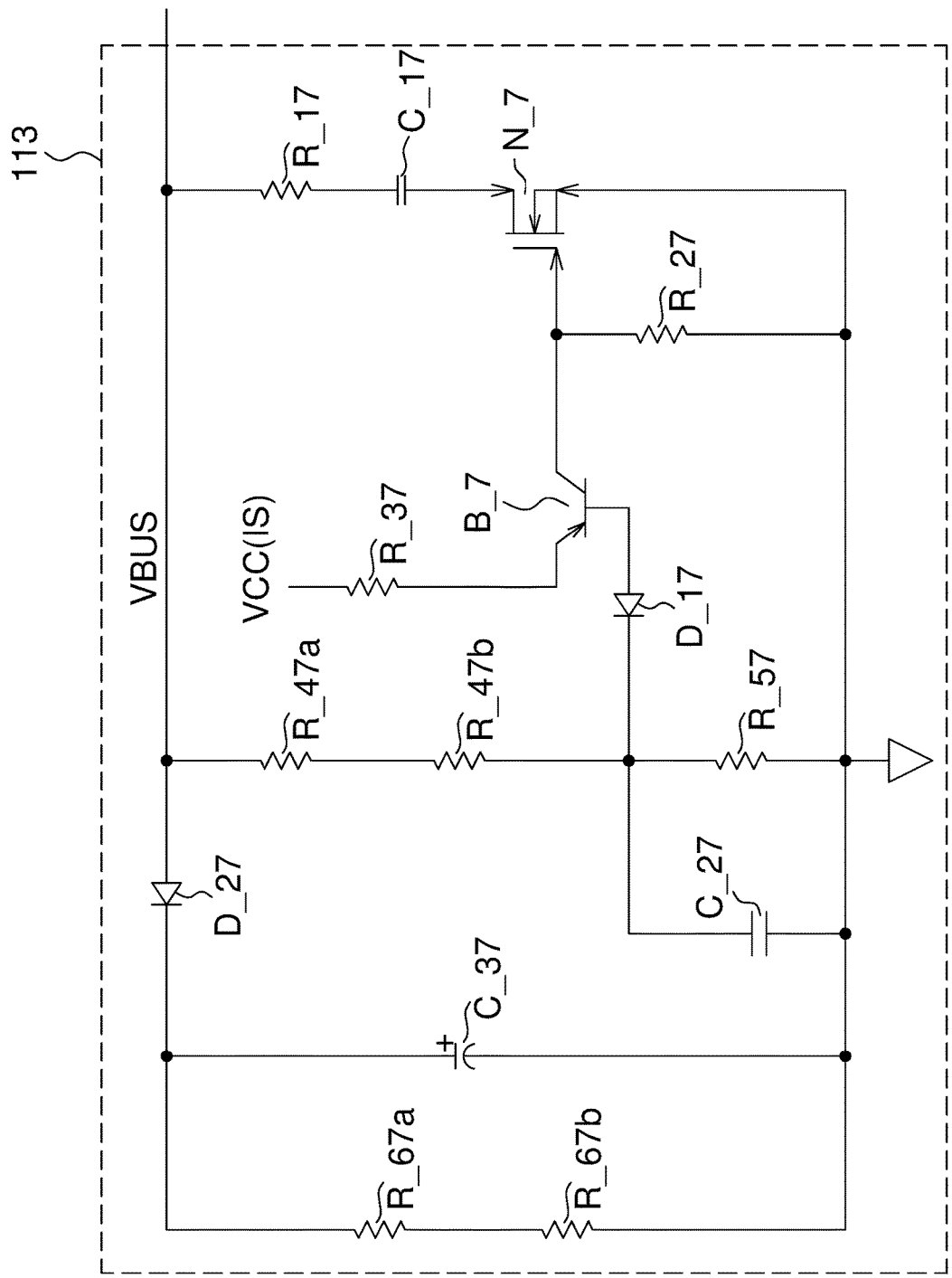
FIG. 7 is a circuit diagram illustrating an example for detail structures of the RC filter illustrated in FIG. 2.

FIG. 6 is a circuit diagram illustrating an example for detailed structures of the auxiliary activate circuit illustrated in FIG. 2. Also, FIG. 7 is a circuit diagram illustrating an example for detailed structures of the RC filter illustrated in FIG. 2.

As illustrated in FIG. 6, the auxiliary activate circuit 111 comprises resistors R_16, R_26a, R_26b, R_46a, R_46b, R_56, diodes D_16, D_26, D_36, Zener diodes Z_16, Z_26, an NMOS N_6, a BJT (bipolar transistor) B_6 and a capacitor C_1. The resistor R_16 comprises a first terminal coupled to a first predetermined voltage source V_BUS, and comprises a second terminal. The first diode D_16 comprises a first terminal coupled to the second terminal of the resistor D_16, and comprises a second terminal. The NMOS N_6 comprises a drain terminal coupled to the second terminal of the diode D_16. The diode D_26 comprises a first terminal coupled to a source terminal of the NMOS N_6, and comprises a second terminal coupled to the phase cutting dimmer 103. The Zener diode Z_16 comprises a first terminal coupled to a gate terminal of the NMOS N_6, and comprises a second terminal coupled to a ground voltage source. The diode D_36 comprises a first terminal coupled to the second terminal of the Zener diode Z_16, and comprises a second terminal coupled to a source terminal of the NMOS N_6.

The resistors R_26a and R_26b are coupled in series and coupled between the first predetermined voltage source V_BUS and the gate terminal of the NMOS N_6. The BJT B_6 comprises a collector coupled to the gate terminal of the NMOS N_6, and comprises an emitter coupled to the ground voltage source. The resistor R_36 comprises a first terminal coupled to a base of the BJT B_6 and comprises a second terminal. The Zener diode Z_26 comprises a first terminal coupled to the second terminal of the resistor R_36, and comprises a second terminal. The resistors R_46a and R_46b are coupled in series and coupled between the first predetermined voltage source V_BUS and the second terminal of the Zener diode Z_26. The resistor R_56 is coupled between the second terminal of the Zener diode Z_26 and the ground voltage source. The capacitor C_1 is coupled between the second terminal of the Zener diode Z_26 and the ground voltage source.

In one embodiment, the phase cutting dimmer 103 is also coupled to the first predetermined voltage source V_BUS. Accordingly, the NMOS N_6 and the BJT B_6 can provide an auxiliary voltage AUX to the phase cutting dimmer 103 for increasing the activate speed of the phase cutting dimmer 103.

In the embodiment shown in FIG. 7, the RC filter 113 comprises: resistors R_17, R_27, R_37, R_47a, R_47b, R_57, R_67a, R_67b, capacitors C_17, C_27, C_37, an NMOS N_7, a BJT B_7, and diodes D_17, D_27. The resistor R_17 comprises a first terminal coupled to a first predetermined voltage level V_BUS, and comprises a second terminal. The capacitor C_17 comprises a first terminal coupled to the second terminal of the resistor R_17 and comprises a second terminal. The NMOS N_7 comprises a drain terminal coupled to the second terminal of the capacitor C_17. The resistor R_27 comprises a first terminal coupled to a gate terminal of the NMOS N_7 and comprises a second terminal coupled to a ground voltage source.

The BJT B_7 comprises a collector coupled to the gate terminal of the NMOS N_7. The third resistor R_37 comprises a first terminal coupled to a second predetermine voltage source VCC, and comprises a second terminal coupled to an emitter of the BJT B_7. In one embodiment, the second predetermine voltage source VCC is replaced by the input signal IS. The diode D_17 comprises a first terminal coupled to a base of the BJT B_7, and comprises a second terminal. The resistors R_47a and R_47b are coupled in series and coupled between the first predetermined voltage source V_BUS and the second terminal of the diode D_17. The resistor R_57 is coupled between the second terminal of the diode D_17 and the ground voltage source. The capacitor C_27 is coupled between the second terminal of the diode D_17 and the ground voltage source. The diode D_27 comprises a first terminal coupled to the first predetermined voltage source V_BUS, and comprises a second terminal. The third capacitor C_37 is coupled between the second terminal of the diode D_27 and the ground voltage source. The sixth resistors R_67a and R_67b are coupled in series and coupled between the first predetermined voltage source V_BUS and the ground voltage source.

The RC filter 113 can filter the noise in the input signal IS for the phase cutting dimmer 103, such that the phase cutting dimmer 103 can provide a more accurate phase cutting signal TRIAC.

In view of above-mentioned embodiments, the present invention can provide a light device driving system having more than one kinds of the dimmers. Thus, the manufactures do not need to respectively prepare a large number of lighting devices with different kinds of dimmers for different clients. Therefore, the storage cost and manufacturing cost can be reduced.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. A PWM signal generating system, comprising:
   a PWM signal generating circuit, configured to generate a PWM signal;
   a control IC, coupled to the PWM signal generating circuit, and configured to control a PWM ratio of the PWM signal via controlling the PWM signal generating circuit;
   a phase cutting dimmer, coupled to the control IC, and configured to output a phase cutting signal to the control IC according to a phase of an input signal;
   a current detecting circuit, coupled to the PWM signal generating circuit and the control IC, and configured to provide a detect current corresponding to the PWM ratio;
   a voltage level dimmer, coupled to the control IC, and configured to generate a preliminary PWM ratio control signal corresponding to an input voltage level, wherein the control IC controls the PWM ratio to correspond to the phase of the input signal, according to the detect current in a first mode, and wherein the control IC controls the PWM ratio according to the preliminary PWM ratio control signal in a second mode; and
   an auxiliary activate circuit, coupled to the phase cutting dimmer, and configured to increase an activate speed of the phase cutting dimmer according to the input signal, wherein the auxiliary activate circuit comprises:
   a first resistor, comprising a first terminal coupled to a first predetermined voltage source, and comprising a second terminal;
   a first diode, comprising a first terminal coupled to the second terminal of the first resistor, and comprising a second terminal;
   an NMOS, comprising a drain terminal coupled to the second terminal of the first diode;
   a second diode, comprising a first terminal coupled to a source terminal of the NMOS, and comprising a second terminal coupled to the phase cutting dimmer;
   a first Zener diode, comprising a first terminal coupled to a gate terminal of the NMOS, and comprising a second terminal coupled to a ground voltage source;
   a third diode, comprising a first terminal coupled to the second terminal of the first Zener diode, and comprising a second terminal coupled to a source terminal of the NMOS;
   at least one second resistor, coupled in series and coupled between the first predetermined voltage source and the gate terminal of the NMOS;
   a BJT, comprising a collector coupled to the gate terminal of the NMOS, and comprising an emitter coupled to the ground voltage source;
   a third resistor, comprising a first terminal coupled to a base of the BJT and comprising a second terminal;
   a second Zener diode, comprising a first terminal coupled to the second terminal of the third resistor, and comprising a second terminal;
   at least one fourth resistor, coupled in series and coupled between the first predetermined voltage source and the second terminal of the second Zener diode;
   a fifth resistor, coupled between the second terminal of the second Zener diode and the ground voltage source; and
   a capacitor, coupled between the second terminal of the second Zener diode and the ground voltage source.

2. The PWM signal generating system of claim 1, further comprising:
   an RC filter, coupled to the auxiliary activate circuit, and configured to filter the input signal.

3. The PWM signal generating system of claim 2, wherein the RC filter comprises:
   a sixth resistor, comprising a first terminal coupled to a first predetermined voltage source, and comprising a second terminal;
   a first capacitor, comprising a first terminal coupled to the sixth terminal of the first resistor, and comprising a second terminal;
   an NMOS, comprising a drain terminal coupled to the second terminal of the first capacitor;
   a seventh resistor, comprising a first terminal coupled to a gate terminal of the NMOS, and comprising a second terminal coupled to a ground voltage source;
   a second BJT, comprising a collector coupled to the gate terminal of the NMOS;
   an eighth resistor, comprising a first terminal coupled to a second predetermine voltage source, and comprising a second terminal coupled to an emitter of the second BJT;
   a fourth diode, comprising a first terminal coupled to a base of the second BJT, and comprising a second terminal;
   at least one ninth resistor, coupled in series and coupled between the first predetermined voltage source and the second terminal of the fourth diode;
   a tenth resistor, coupled between the second terminal of the fourth diode and the ground voltage source;
   a second capacitor, coupled between the second terminal of the fourth diode and the ground voltage source;
   a fifth diode, comprising a first terminal coupled to the first predetermined voltage source, and comprising a second terminal;
   a third capacitor, coupled between the fifth terminal of the second diode and the ground voltage source; and
   at least one eleventh resistor, coupled in series and coupled between the first predetermined voltage source and the ground voltage source.

4. The PWM signal generating system of claim 1, wherein the PWM signal generating circuit comprises:
   an NMOS;
   a sixth resistor, comprising a first terminal coupled to a gate terminal of the NMOS, and comprising a second terminal coupled to the control IC;

a seventh resistor, comprising a first terminal coupled to the gate terminal of the NMOS, and comprising a second terminal;

an eighth resistor, comprising a first terminal coupled to the gate terminal of the NMOS, and comprising a second terminal coupled to the current detecting circuit; and a fourth diode, comprising a first terminal coupled to the seventh terminal of the second resistor, and comprising a second terminal coupled to the control IC;

wherein the current detecting circuit is coupled to the source terminal of the NMOS.

5. The PWM signal generating system of claim 4, wherein the current detecting circuit comprises a plurality of resistors coupled in parallel and between the source terminal of the NMOS and a ground voltage source.

6. A light device driving system, comprising:

a main power receiving circuit, configured to receive a main power;

an EMI filter, coupled to the main power receiving circuit;

a bridge rectifier, coupled to the EMI filter, wherein the EMI filter and the bridge rectifier process the main power, thereby the bridge rectifier outputs an input signal;

a transformer, configured to receive the input signal and a PWM signal for generating an output current to drive a light device;

a PWM signal generating circuit, configured to generate the PWM signal;

a control IC, coupled to the PWM signal generating circuit, and configured to control a PWM ratio of the PWM signal via controlling the PWM signal generating circuit;

a phase cutting dimmer, coupled to the control IC, and configured to output a phase cutting signal to the control IC according to a phase of the input signal;

a current detecting circuit, coupled to the PWM signal generating circuit and the control IC, and configured to provide a detect current corresponding to the PWM ratio; and a voltage level dimmer, coupled to the control IC, configured to generate a preliminary PWM ratio control signal corresponding to an input voltage level, wherein the control IC controls the PWM ratio to correspond to the phase of the input signal, according to the detect current in a first mode, and wherein the control IC controls the PWM ratio according to the preliminary PWM ratio control signal in a second mode; and an auxiliary activate circuit, coupled to the phase cutting dimmer, configured to increase an activate speed of the phase cutting dimmer according to the input signal, wherein the auxiliary activate circuit comprises:

a first resistor, comprising a first terminal coupled to a first predetermined voltage source, and comprising a second terminal;

a first diode, comprising a first terminal coupled to the second terminal of the first resistor, and comprising a second terminal;

an NMOS, comprising a drain terminal coupled to the second terminal of the first diode;

a second diode, comprising a first terminal coupled to a source terminal of the NMOS, and comprising a second terminal coupled to the phase cutting dimmer;

a first Zener diode, comprising a first terminal coupled to a gate terminal of the NMOS, and comprising a second terminal coupled to a ground voltage source;

a third diode, comprising a first terminal coupled to the second terminal of the first Zener diode, and comprising a second terminal coupled to a source terminal of the NMOS;

at least one second resistor, coupled in series and coupled between the first predetermined voltage source and the gate terminal of the NMOS;

a BJT, comprising a collector coupled to the gate terminal of the NMOS, and comprising an emitter coupled to the ground voltage source;

a third resistor, comprising a first terminal coupled to a base of the BJT and comprising a second terminal;

a second Zener diode, comprising a first terminal coupled to the second terminal of the third resistor, and comprising a second terminal;

at least one fourth resistor, coupled in series and coupled between the first predetermined voltage source and the second terminal of the second Zener diode;

a fifth resistor, coupled between the second terminal of the second Zener diode and the ground voltage source; and a capacitor, coupled between the second terminal of the second Zener diode and the ground voltage source.

7. The light device driving system of claim 6, further comprising:

an RC filter, coupled to the auxiliary activate circuit, and configured to filter the input signal.

8. The light device driving system of claim 7, wherein the RC filter comprises:

a sixth resistor, comprising a first terminal coupled to a first predetermined voltage source, and comprising a second terminal;

a first capacitor, comprising a first terminal coupled to the second terminal of the sixth resistor, and comprising a second terminal;

an NMOS, comprising a drain terminal coupled to the second terminal of the first capacitor;

a seventh resistor, comprising a first terminal coupled to a gate terminal of the second NMOS, and comprising a second terminal coupled to a ground voltage source;

a second BJT, comprising a collector coupled to the gate terminal of the second NMOS;

an eighth resistor, comprising a first terminal coupled to a second predetermine voltage level, and comprising a second terminal coupled to an emitter of the second BJT;

a fourth diode, comprising a first terminal coupled to a base of the second BJT, and comprising a second terminal;

at least one ninth resistor, coupled in series and coupled between the first predetermined voltage source and the second terminal of the fourth diode;

a tenth resistor, coupled between the second terminal of the fourth diode and the ground voltage source;

a second capacitor, coupled between the second terminal of the fourth diode and the ground voltage source;

a fifth diode, comprising a first terminal coupled to the first predetermined voltage source, and comprising a second terminal;

a third capacitor, coupled between the second terminal of the fifth diode and the ground voltage source; and at least one eleventh resistor, coupled in series and coupled between the first predetermined voltage source and the ground voltage source.

9. The light device driving system of claim 6, wherein the PWM signal generating circuit comprises:

a second NMOS;

a sixth resistor, comprising a first terminal coupled to a gate terminal of the second NMOS, and comprising a second terminal coupled to the control IC;

a seventh resistor, comprising a first terminal coupled to the gate terminal of the NMOS, and comprising a second terminal;

an eighth resistor, comprising a first terminal coupled to the gate terminal of the second NMOS, and comprising a second terminal coupled to the current detecting circuit; and a diode, comprising a first terminal coupled to the second terminal of the seventh resistor, and comprising a second terminal coupled to the control IC;

wherein the current detecting circuit is coupled to the source terminal of the second NMOS.

10. The light device driving system of claim 9, wherein the current detecting circuit comprises a plurality of resistors coupled in parallel and between the source terminal and a ground voltage source.

* * * * *